United States Patent [19]

Fulton

[11] 3,999,204
[45] Dec. 21, 1976

[54] SUPERCURRENT DEVICES HAVING ELECTRODE CONFIGURATIONS FOR MOVING VORTICES UNDER MAGNETIC FIELD CONTROL

[75] Inventor: Theodore Alan Fulton, Warren Township, Somerset County, N.J.

[73] Assignee: Bell Telephone Laboratories, Incorporated, Murray Hill, N.J.

[22] Filed: Dec. 3, 1975

[21] Appl. No.: 637,176

[52] U.S. Cl. .................................. 357/5; 307/306
[51] Int. Cl.² .................................... H01L 39/22
[58] Field of Search ..................... 357/5; 307/306

[56] References Cited
UNITED STATES PATENTS

| | | | |
|---|---|---|---|
| 3,676,718 | 7/1972 | Anderson | 307/306 |
| 3,689,780 | 9/1972 | Meissner | 307/306 |
| 3,911,333 | 10/1975 | Notarys | 357/5 |
| 3,936,677 | 2/1976 | Fulton et al. | 307/306 |

Primary Examiner—Martin H. Edlow
Attorney, Agent, or Firm—Michael J. Urbano

[57] ABSTRACT

In an extended weak-link supercurrent device potential wells for vortices are created by the geometric configuration of one of the superconductive electrodes and are moved from one well to another by a magnetic field applied in the plane of the junction. In one embodiment the electrode has a plurality of spaced triangular notches along one edge. The notches are asymmetric in order to insure directionality of vortex flow. Other embodiments having a pig-tail or serpentine form are also described.

17 Claims, 8 Drawing Figures

SUPERCURRENT DEVICES HAVING ELECTRODE CONFIGURATIONS FOR MOVING VORTICES UNDER MAGNETIC FIELD CONTROL

BACKGROUND OF THE INVENTION

This invention relates to elongated weak-link supercurrent devices and, more particularly, to controlling the propagation of mobile flux vortices in such devices.

In U.S. Pat. No. 3,676,718 granted to P. W. Anderson, R. C. Dynes and T. A. Fulton on July 11, 1972, there are described a variety of weak-link supercurrent devices (e.g., shift registers, memories) which are capable of sustaining one or more trapped magnetic field (flux) vortices which correspond to information bits. In an extended Josephson junction (SIS) device, that is, one which is long in the x-direction compared to the Josephson penetration depth $\lambda_J$, the patent teaches that a vortex is induced by a spatial variation of the supercurrent J in which a positive supercurrent flows through the I-layer and into the contiguous superconductor to a depth of about $\lambda_L$, the London penetration depth, then along the superconductor a distance of about $2\lambda_J$, thence through the I-layer again as a negative supercurrent into the opposite superconductor to a depth of about $\lambda_L$ and finally back to the point of beginning. Such a vortex supports a net magnetic flux of approximately $\Phi_o = 2.07 \times 10^{-15}$ Wb, the well-known flux quantum. As defined in the patent, the term vortex means an entity which includes both the circulating supercurrent J and the flux quantum $\Phi_o$ induced thereby.

Once created, the patent states, a vortex prefers to position and distribute itself in a region so that a local minimum of the sum of the magnetic energy plus the Josephson coupling energy is established. These local minima can be thought of as magnetic potential wells in which vortices can be stored. Where a plurality of such potential wells are present in a single weak-link structure, it is possible to move the vortex from one well to another by applying a force thereto as, for example, by applying a local current or magnetic field to a region near to the vortex. As discussed at column 4, lines 14–41 of the patent, potential wells can be created in a number of ways including periodically varying the thickness of the weak-link layer in an SIS structure (FIG. 6 of the patent), using point sources of magnetic field (FIGS. 7A and 7B of the patent), using locally applied currents at periodic locations of the structure (FIG. 8 of the patent), periodically varying the self-inductance per unit length of the structure (FIG. 9 of the patent) or, alternatively, varying the thickness of at least one of the superconductors so that in each memory location it is less about $2\lambda_L$.

For some applications, however, it may be inconvenient to form the potential wells by using a pair of wires at each well location or point sources of magnetic field. Moreover, having to vary oxide or superconductor thickness complicates processing and may reduce device yield.

SUMMARY OF THE INVENTION

Accordingly, it is proposed that an external magnetic control field be used in conjunction with a suitable geometric configuration of the junction (or its auxiliary components, e.g., electrodes) to create a nonuniform and variable magnetic field at the junction. A feature of one embodiment of the invention is a junction configuration which creates spaced, asymmetric potential wells ("geometric" wells) and a suitably applied magnetic control field which creates "dynamic" potential wells between the geometric wells. The control field causes a vortex in an upstream geometric well to move to an adjacent downstream dynamic well. When the control field is removed, the asymmetry of the geometric wells causes the vortex to move to a downstream geometric well where it remains until the control field is again applied.

In a preferred embodiment the junction configuration is achieved by forming spaced triangular notches along at least one edge of one of the superconductive electrodes. The control field is pulsed and is applied in the same direction as the vortex field in the junction. In other embodiments also described the superconductive electrode(s) takes on other geometric configurations such as a pig-tail or serpentine form, and the control field is applied in other ways, such as an in-plane rotating field or as an oscillating field.

BRIEF DESCRIPTION OF THE DRAWING

The invention, together with its various features and advantages, can be easily understood from the following more detailed description taken in conjunction with the accompanying drawing, in which.

DETAILED DESCRIPTION

In each of the embodiments described below it will be understood that cryogenic means, not shown but well known in the art, is generally provided in order to induce superconductivity in the superconductive layers of the devices.

Figure 1:
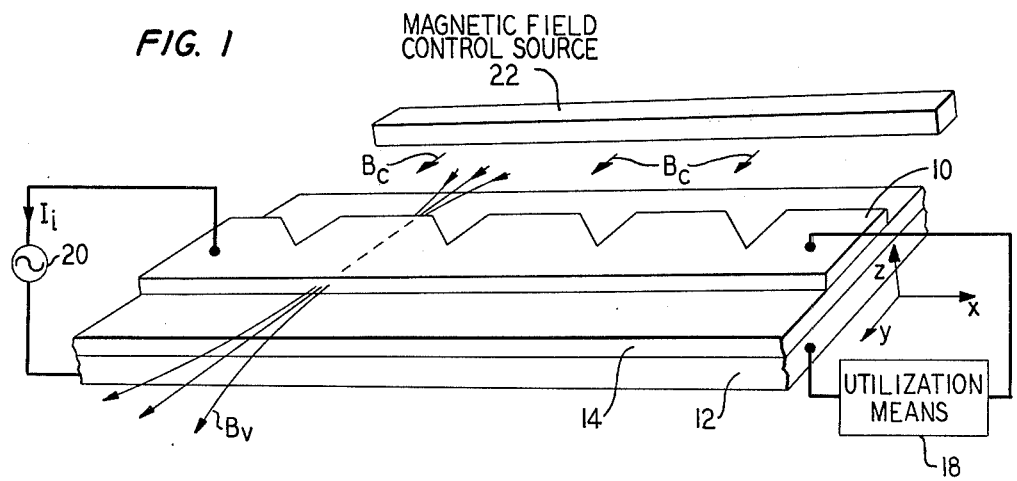
FIG. 1 is a schematic, pictorial view of one embodiment of the invention.

Before discussing in detail the various embodiments of our invention, it will be helpful to consider first the motion of a flux vortex as it propagates along an extended supercurrent device of the type shown in FIG. 1 but with the notches omitted. The device is a sandwich structure including a pair of superconductive layers or electrodes 10 and 12 separated by a weak-link layer 14 sufficiently thin to permit two-particle tunneling therethrough. Layer 14 is typically an insulator (e.g., oxide), thus forming an SIS structure of the type described by J. M. Rowell in U.S. Pat. No. 3,281,609 (e.g., Pb-PbO-Pb). However, the device of FIG. 1 is an extended structure; that is, its length in the direction of vortex propagation (x-direction) is much greater than the Josephson penetration depth $\lambda_J$. A weak-link SIS device is commonly known as a Josephson junction device. In this context the term junction may be thought of as including the portion of the weak-link layer common to both superconductive electrodes and at least the contiguous portions of both electrodes in which the vortex supercurrent flows.

Vortices are generated at one end of the device by means of a current source 20 in the manner described in the aforementioned U.S. Pat. No. 3,676,718. That is, the input current $I_i$ from source 20 is maintained below the critical supercurrent $I_c$ of the weak-link structure so that during operation the structure is at all times in a supercurrent state. However, the input source 20 may be pulsed in order to produce an encoded train of input current pulses $I_i$ each of which in turn generates a separate vortex. Each vortex, which propagates in the x-direction with a velocity and to a distance determined by damping processes, is characterized by a circulating supercurrent (not shown) and a magnetic field $B_v$ induced thereby. The magnetic field has associated with it a well-known flux quantum $\Phi_o$.

At the other end the device vortices are coupled to utilization means 18 connected across superconductive electrodes 10 and 12. Illustratively, utilization means 18 comprises a supercurrent magnetometer of the quantum interference type described in U.S. Pat. No. 3,676,718 (FIG. 10A), also known by the acronym SQUID, Superconducting QUantum Interference Device. When using a SQUID actual electrical connection to electrodes 10 and 12 need not be made because only the magnetic field of the vortex is sensed.

Also shown in FIG. 1 is a magnetic field control source 22 for generating a magnetic field $B_c$ in the plane of the junction. As described hereinafter, the control field creates dynamic potential wells effective to move vortices from one geometric potential well to another, the latter being formed by the shape of one of the superconductive electrodes.

Figure 2:
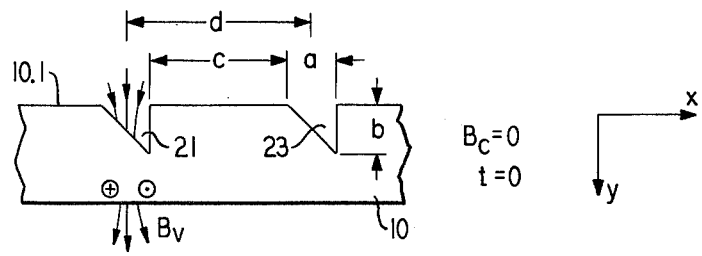
FIGS. 2, 3, and 4 show a portion of the top superconductive electrode of the embodiment of FIG. 1 and are used to describe the operation of that embodiment.
Figure 3:
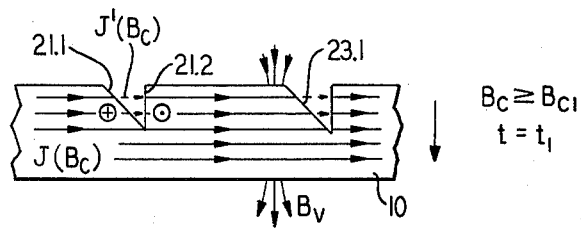
Figure 4:
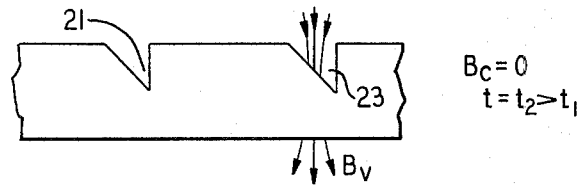

More particularly, consider FIGS. 2–4 which show a top view of superconductive electrode 10 in the general shape of a rectangular stripe. For simplicity the other components of the structure of FIG. 1 have been omitted. Electrode 10 includes a plurality of uniformly spaced notches along one edge 10.1. Typically the center-to-center spacing $d$ is about $4\lambda_J$ to $10\lambda_J$ and the dimension $a$ of each notch is about $\frac{1}{8}d$ to $\frac{1}{2}d$. Illustratively only four notches are depicted in FIG. 1 and only two designated 21 and 23 are shown in FIGS. 2–4. In practice, of course, the number of notches used depends on design considerations such as the number of information bits (vortices) to be processed by the particular device (e.g., shift register, memory). Note that the junction takes on the shape of electrode 10.

Assume that at time $t = 0$ the control field $B_c = 0$ and a vortex, created by a current pulse from source 20, has propagated from the left along the junction until it stops in a potential well formed by notch 21 as shown in FIG. 2. This well is termed a geometric well because it is created by the geometric configuration of electrode 10. Such a notch locally reduces the magnetic energy (increases the self-inductance per unit length). That such a notch constitutes a potential well is clear from the discussion at column 8, lines 8–22 of U.S. Pat. No. 3,676,718.

From a logic standpoint, the presence of a vortex in a notch can be thought of as a logical one and conversely the absence of a vortex as a logical zero.

In order to move the vortex along the junction from left to right, at time $t = t_1$ control source 22 is made to generate a magnetic field pulse having a component in the plane of the junction and in the +y-direction. Note that the term pulse as used herein does not exclude a sinusoidal field. The magnitude of the field component should be on the order of $B_{cl}$, that threshold magnitude of magnetic field which, when applied in the plane of an extended junction and in the +y-direction, creates a vortex at each end of the junction. Preferably, the direction of the entire control field should be the same as that of the vortex field in the junction. Under these conditions a dynamic potential well is created between the notches 21 and 23. The vortex moves to the position of the dynamic well which, as shown in FIG. 3, is nearer notch 23 than 21.

This phenomenon can be understood as follows. If, as in the geometry of FIG. 1, the vortex field is in the +y-direction, a negative applied current from source 20 (i.e., current, as shown, which is applied to electrode 12 and taken from electrode 10) will result in a force on the vortex in the +x-direction. Reversing the direction of the vortex field or the applied current, of course, reverses the direction of the force. In addition, the closer to the center of the vortex that the current is applied, the stronger will be the force.

The control field $B_c$ induces in electrode 10 a surface current $J(B_c)$ which, for the sense of $B_c$ shown in FIG. 3, flows from left to right. At the oblique edge 21.1 of notch 21, however, the surface current flows down through the weak-link layer 14 (circle with plus sign in FIG. 3) along the lower superconductive electrode 12 as current component $J'(B_c)$, then up through layer 14 again (circle with dot). Comparing FIGS. 2 and 3, it is clear that the surface current $J(B_c)$ acts as a positive applied current on the left-hand side of notch 21 and an equal negative applied current on the right-hand side of notch 21. Thus, it would appear at first that the surface current applies equal and opposite forces to the vortex in notch 21. However, the vortex prefers to minimize its total energy by positioning itself at the point of minimum electrode width, e.g., at the apex of the notch 21. Because notch 21 is asymmetric, more of the surface current along vertical edge 21.2 is nearer the center of the vortex than the surface current along oblique edge 21.1. Consequently, for the sign of $B_v$ shown in FIG. 2 the attractive force to the right is greater than the attractive force to the left, resulting in a net force which pulls the vortex out of notch 21 and into the position shown in FIG. 3. The vortex comes to rest nearer to notch 23 because, analogous to the situation above, the repulsive force caused by surface current entering near oblique edge 23.1 of notch 23 is weaker than that caused by surface current at vertical edge 21.2 of notch 21. To this end the dynamic potential wells should be deeper than the geometric wells.

At time $t = t_2 > t_1$ (FIG. 4), when $B_c$ is removed or reduced below $B_{cl}$, the dynamic potential well is gone and the vortex moves into notch 23 where it rests until $B_c$ is again applied. The vortex moves into notch 23, rather than returning to notch 21, because, in a qualitative sense much more of its magnetic field overlaps the nearer potential well of notch 23 as compared to the more remote notch 21.

The time difference $t_2 - t_1$ defines the control pulse duration which should not be so short that a vortex moved out of one notch has so much energy that it propagates through the next downstream notch without stopping. Appropriate pulse durations can be determined empirically and are a function of damping in the supercurrent structure. Similarly, the repetition rate of the control pulses is limited theoretically by the RC time constant of the structure and practically by the speed of available electronic circuitry.

Figure 5A:
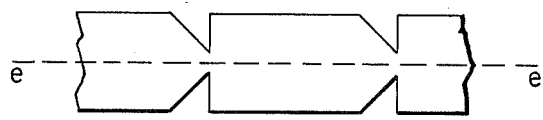
FIGS. 5A and 5B show superconductive electrodes similar to FIGS. 2–4 but having notches along both edges.
Figure 5B:
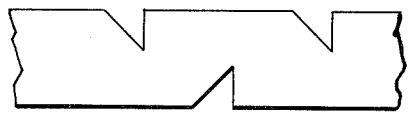

In general, superconductive electrode 10 includes a plurality of segments of one width (e.g., those between notches) joined to one another by segments of narrower width (e.g., those including notches) which form geometric potential wells in which vortices tend to rest. The shape of the electrode is adapted to insure directionality to vortex flow. To provide such directionality in the embodiment of FIG. 1, a suitable notch (21) has an upstream edge (21.1) which intersects a downstream edge (21.2), and the slope of the upstream edge is less than that of the downstream edge. As shown in FIGS. 5A and 5B, notches may be provided along both edges. For illustration purposes only, the electrode of FIG. 5A has mirror symmetry about line e—e; that is, the notches along parallel edges are in substantial registration with one another. The notches could be staggered, however, as in FIG. 5B.

EXAMPLE

Movement of a vortex from notch 21 to 23 in the device of FIGS. 1–4 has been successfully demonstrated. Layers 10, 12 and 14 comprised tin, tin oxide and tin, respectively. The tin layers (electrodes) were about 3,000 Å thick and the tin oxide layer was about 20 to 50 Å thick. Electrode 10 was about 8 mils wide ($y$-dimension) whereas electrode 12 was about 20 mils wide. Notches 21 and 23 were both right triangles having dimensions $a = 6$ mils and $b = 3$ mils. The notches were separated by a distance $c = 6$ mils corresponding to a center-to-center spacing of 12 mils ($\sim 4\lambda_J$). For these parameters $I_c$ was about 13 ma, $\lambda_J$ was about $7 \times 10^{-3}$ cm ($\sim 3$ mils), $J_c$ was about 50 A/cm$^2$, and $B_{c1}$ was about 0.5 Gauss. A vortex moved from notch 21 to notch 23 in a pulsed magnetic control field $B_c$. Peak fields ranging from about 0.5 to 1 Gauss were used. The fastest magnetic pulse used was about 5 msec.

ALTERNATIVE EMBODIMENTS

Figure 6:
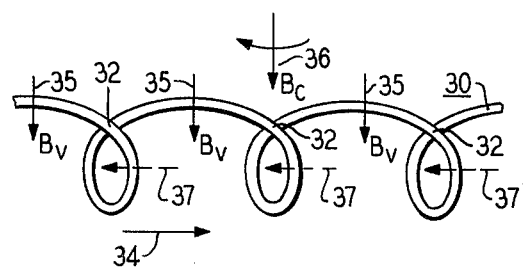
FIG. 6 is a schematic of another embodiment of the invention depicting a pig-tail configuration of a supercurrent transmission line used in conjunction with an in-plane rotating magnetic control field.

Turning now to FIG. 6 there is shown an alternative embodiment depicting an entire supercurrent transmission line 30 in a pig-tail configuration. At the crossover points 32 an electrically insulative layer (not shown) separates the overlapping portions and substantially prevents two-particle tunneling therethrough. Dynamic potential wells are formed at those positions where the vortex fields $B_v$ are aligned parallel to $B_c$, a rotating in-plane magnetic control field depicted at 36. Preferably only one such position exists per each periodic interval (e.g., positions 35 for $B_c$ pointed downwardly or positions 37 for $B_c$ pointed to the left). To move the vortices in the direction of arrow 34, the field $B_c$ should be rotated clockwise. However, the amplitude of $B_c$ need not be on the order of $B_{c1}$; rather a much smaller field can be employed because no abrupt changes in electrode width are employed.

Figure 7:
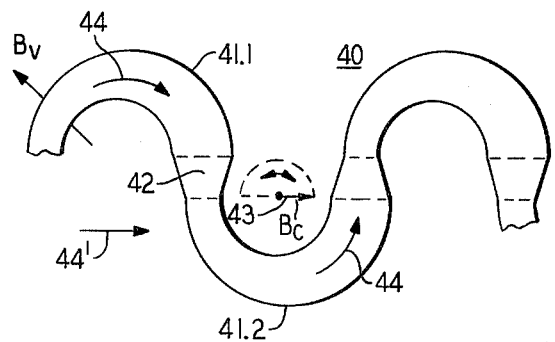
FIG. 7 is a schematic of yet another embodiment of the invention depicting a serpentine superconductive electrode used in conjunction with an oscillating magnetic control field.

In another embodiment shown in FIG. 7 one of the superconductive electrodes 40 has a serpentine configuration. The structure comprises a plurality of curved segments of tapered width with alternate segments 41.1 and 41.2 being respectively curved upwardly and downwardly. The taper of the curved segments increases in the direction of vortex propagation (arrow 44). Adjacent curved segments (e.g., 41.1 and 41.2) are connected to one another by a tapered segment (e.g., 42) whose width decreases in the direction of vortex propagation. The purpose of the tapered segments such as segment 42 is to provide directionality to vortex propagation. The magnetic control field $B_c$ oscillates through 180° (as shown at 43) so that at one extreme it is oriented along the overall direction of vortex propagation (arrow 44') and at the other extreme it is oriented opposite to arrow 44'. As with the embodiment of FIG. 7, $B_c$ need not be on the order of $B_{c1}$, but may be much smaller, because only gradual changes in electrode width are employed.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A superconductive device comprising
    a supercurrent structure which includes a pair of superconductive layers and a weak-link layer separating said superconductive layers and contiguous therewith,
    said structure being adapted to support the propagation of mobile flux vortices therein and having a length, as measured in the direction of said propagation, which is much greater than the Josephson penetration depth $\lambda_J$, characterized in that
    at least one of said superconductive layers includes a plurality of segments of one width joined to one another by segments of narrower width which form potential wells in which vortices tend to rest, said segments being shaped to provide directionality to vortex propagation.

2. The device of claim 1 wherein adjacent narrower segments are uniformly separated by a distance of about $4\lambda_J$ to $10\lambda_J$ and have a dimension in the direction of vortex propagation which is about one-third to one-half said distance.

3. The device of claim 1 in combination with means for moving said vortices from one well to another by applying a magnetic control field to said structure in the plane of said weak-link layer and in the same direction as the magnetic field of said vortices in said weak-link layer.

4. The device of claim 3 wherein said control field is on the order of $B_{c1}$, the vortex creation field.

5. The device of claim 4 wherein said control field is a train of pulses.

6. The device of claim 1 wherein said at least one layer is a rectangular stripe having a plurality of uniformly spaced notches which define said narrower segments, said notches each having an upstream edge and a downstream edge with the slope of the latter being greater than that of the former.

7. The device of claim 6 in combination with means for moving said vortices from one notch to another by applying a pulsed magnetic control field to said structure in the plane of said weak-link layer and in the same direction as the magnetic field of said vortices in said weak-link layer.

8. A superconductive device comprising
    a supercurrent structure which includes a pair of superconductive layers and a weak-link layer separating said superconductive layers and contiguous therewith,
    said structure being adapted to support the propagation of mobile flux vortices therein and having a length, as measured in the direction of said propagation, which is much greater than the Josephson penetration depth $\lambda_J$, characterized in that at least one of said superconductive layers comprises a plurality of curved segments each of tapered width which increases in the direction of vortex propagation, alternate ones of said curved segments being curved in opposite directions, and a plurality of tapered segments joining adjacent ones of said curved segments, the width of the taper of each tapered segment decreasing in the direction of vortex propagation.

9. The device of claim 8 in combination with means for moving said vortices by applying a magnetic control field to said structure in the plane of said weak-link layer, said field oscillating between a direction parallel to the overall direction of vortex propagation to a direction opposite thereto.

10. A superconductive device comprising
a supercurrent structure which includes a pair of superconductive layers and a weak-link layer separating said superconductive layers and contiguous therewith,
said structure being adapted to support the propagation of mobile flux vortices therein and having a length, as measured in the direction of said propagation, which is much greater than the Josephson penetration depth $\lambda_J$, characterized in that
said structure has a pig-tail configuration and at the cross-over points of said configuration means insulates one portion of the structure from the adjacent portion to substantially prevent two particle tunneling therethrough.

11. The device of claim 10 in combination with means for moving said vortices by applying to said structure a rotating magnetic control field in the plane of said weak-link layer.

12. Superconductive apparatus comprising
a supercurrent structure which includes a pair of superconductive layers and a weak-link layer separating said superconductive layers and contiguous therewith,
said structure being adapted to support the propagation of mobile flux vortices therein and having a length, as measured in the direction of said propagation, which is much greater than the Josephson penetration depth $\lambda_J$, characterized in that
at least one of said superconductive layers includes a plurality of uniformly spaced, asymmetrically shaped notches along at least one edge thereof, said notches creating potential wells in which vortices tend to reside, and
said apparatus includes means for moving said vortices from one notch to another by applying a pulsed magnetic control field in the plane of said weak-link layer and in the same direction as the magnetic field of said vortices in said weak-link layer, the magnitude of said control field being on the order of $B_{cl}$, the vortex creation field of said structure.

13. The apparatus of claim 12 wherein said notches are triangularly shaped and have intersecting upstream and downstream edges, the slope of the latter being greater than that of the former.

14. The apparatus of claim 13 wherein adjacent notches are separated by a distance of about $4\lambda_J$ to $10\lambda_J$ and have a dimension in the direction of vortex propagation which is about one-third to one-half said distance.

15. The apparatus of claim 12 wherein said at least one superconductive layer has notches along two parallel edges thereof.

16. The apparatus of claim 15 wherein the notches along one of said edges are in substantial registration with notches along the other of said edges.

17. The apparatus of claim 15 wherein the notches along one of said edges are staggered with respect to notches along the other of said edges.

* * * * *